(12) United States Patent
Shafer

(10) Patent No.: US 7,218,453 B2
(45) Date of Patent: May 15, 2007

(54) PROJECTION SYSTEM, IN PARTICULAR FOR A MICROLITHOGRAPHIC PROJECTION EXPOSURE APPARATUS

(75) Inventor: David Shafer, Fairfield, CT (US)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/346,201

(22) Filed: Feb. 3, 2006

(65) Prior Publication Data

US 2006/0187555 A1 Aug. 24, 2006

Related U.S. Application Data

(60) Provisional application No. 60/649,557, filed on Feb. 4, 2005.

(51) Int. Cl.
*G02B 17/08* (2006.01)

(52) U.S. Cl. ....................... 359/649; 359/727

(58) Field of Classification Search ............... 359/649, 359/650, 651, 727, 728
See application file for complete search history.

(56) References Cited

U.S. PATENT DOCUMENTS

| | | | |
|---|---|---|---|
| 4,812,028 A | 3/1989 | Matsumoto | |
| 5,031,976 A | 7/1991 | Shafer | |
| 5,052,763 A | 10/1991 | Singh et al. | |
| 5,257,139 A | 10/1993 | Higuchi | |
| 5,488,299 A | 1/1996 | Kondo et al. | |
| 5,717,518 A | 2/1998 | Shafer et al. | |
| 6,600,608 B1 | 7/2003 | Shafer et al. | |
| 6,663,350 B2 | 12/2003 | Tyree, Jr. | |
| 2005/0248856 A1 | 11/2005 | Omura et al. | |

FOREIGN PATENT DOCUMENTS

| | | |
|---|---|---|
| JP | 2003-114387 A | 4/2003 |
| WO | WO 01/51979 A2 | 7/2001 |
| WO | WO 01/55767 A2 | 8/2001 |
| WO | WO 03/050587 A2 | 6/2003 |
| WO | WO 2004/019128 A2 | 3/2004 |

*Primary Examiner*—Scott J. Sugarman
(74) *Attorney, Agent, or Firm*—Sughrue Mion, PLLC

(57) ABSTRACT

A projection system for imaging an object field onto an image field, including at least two partial objectives (S1, S2); at least one intermediate image field between the partial objectives (S1, S2); and a concave reflector (119, 219) having a concave reflecting surface. The concave reflecting surface crosses an optical axis of the projection system proximate along the optical axis to the intermediate image field. Alternatively or in addition, the concave reflecting surface crosses an optical axis of the projection system at a position where the condition $|H_{CR}/H_{MR}| \geq 2$ is met, with $H_{CR}$ being a chief ray height and $H_{MR}$ being a marginal ray height with respect to the optical axis. Alternatively or in addition, the concave reflecting surface crosses an optical axis of the projection system at a position where the condition: $d = y*L$ is met, with d being an axial distance from the concave reflecting surface to the intermediate image field, and with L being the total geometrical light path travelled by a light beam along the optical axis from the object field to the image field, wherein y ranges from 0 to 0.10.

35 Claims, 4 Drawing Sheets

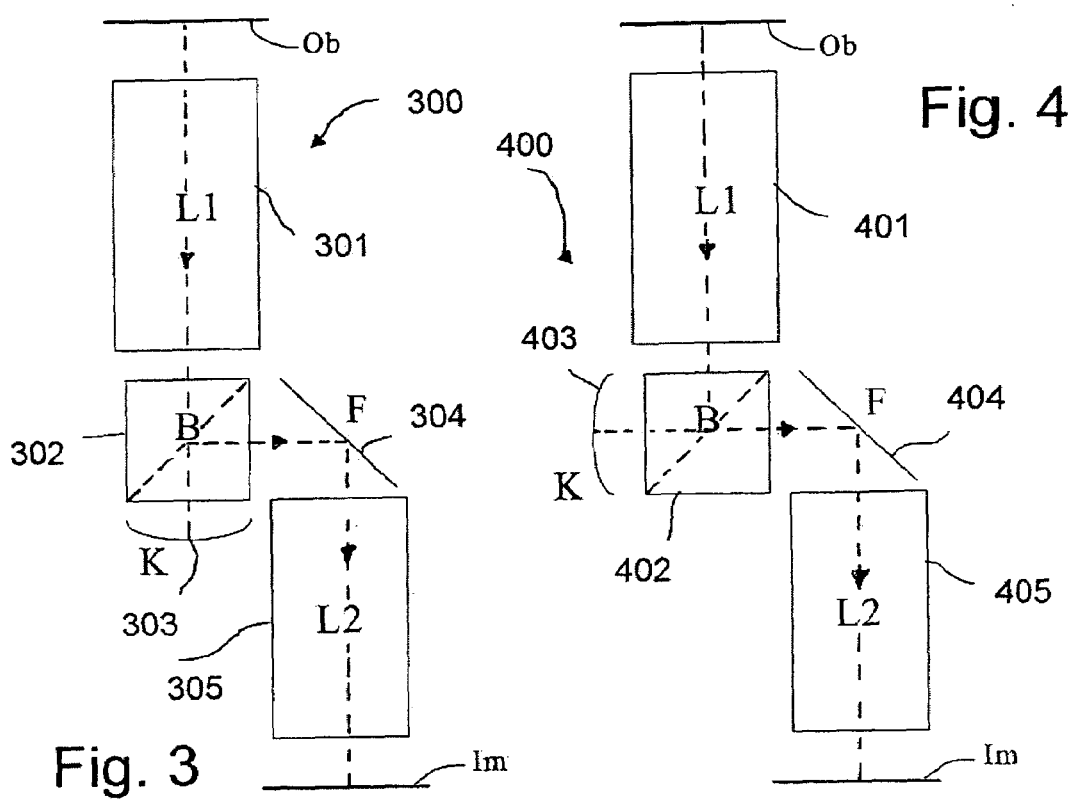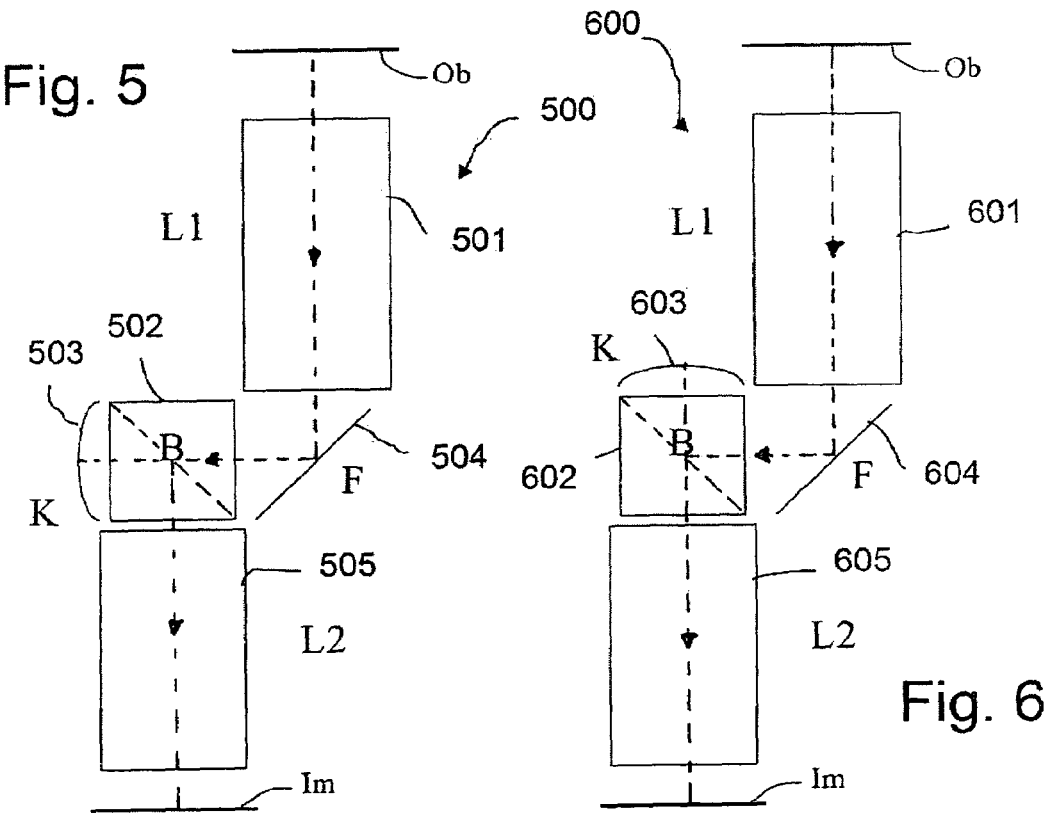

PROJECTION SYSTEM, IN PARTICULAR FOR A MICROLITHOGRAPHIC PROJECTION EXPOSURE APPARATUS

The application claims the benefit of U.S. Provisional Application No. 60/649,557, filed Feb. 4, 2005, the full disclosure of which is incorporated hereby into the present application by reference.

BACKGROUND OF THE INVENTION

1. Field of the Invention

The present invention relates to a projection system, in particular for a microlithographic projection exposure apparatus.

2. Description of Related Art

Microlithography is used in the fabrication of microstructured components like integrated circuits, LCD's and other microstructured devices. The microlithographic process is performed in a so-called projection exposure apparatus comprising an illumination system and a projection system. The image of an illuminated mask (or reticle) is projected onto a resist-covered substrate, typically a silicon wafer bearing one or more light-sensitive layers and being provided in the image plane, in order to transfer the circuit pattern onto the light-sensitive layers on the wafer.

Generally, the image field of any optical system such as the projection system of the projection exposure apparatus is curved, and the degree of curvature is determined by the Petzval sum. The correction of the Petzval sum is becoming more and more important in view of the increasing demands to project large object fields with increased resolutions.

Various attempts to avoid curved image fields are known. Their following discussion is not exhaustive and given without prejudicial admission of prior art.

One group of approaches to overcome the problem of curved image fields includes the use of curved substrates and/or masks having a curvature which is the negative of the curvature of the optical system. Reference is exemplarily given to U.S. Pat. No. 5,257,139 (to Higuchi).

A further approach is the use of catadioptric systems, which combine both refracting elements (e.g. lenses) and reflecting elements (e.g. mirrors). While the contributions of positive-powered and negative-powered lenses in an optical system to power, surface curvature and chromatic aberration are opposite to each other, a concave mirror has positive power like a positive-powered lens, but an opposite effect on surface curvature without contributing to chromatic aberrations.

Various design alternatives for catadioptric systems are known in the prior art.

U.S. Pat. No. 5,052,763 (to Singh et al.) discloses an optical system having an input subsystem (e.g. catadioptric system) which has a curved image field being the input object to a second (e.g. dioptric) subsystem the output of which is a flat image field, wherein the first subsystem is designed to compensate for the field curvature of the second subsystem to result in a substantially flat image field. The input subsystem provides an image of an object on an intermediate image surface having a curvature being substantially opposite of the field curvature of the second subsystem.

A different, single-axis projection system is disclosed in WO 01/055767 A3 and U.S. Pat. No. 6,663,350 B2 (to Shafer), said projection system being devoid of planar folding mirrors and being preferably composed, in sequence from the object side towards the image side, of a catadioptric group giving a real intermediate image, a catoptric or catadioptric group giving a virtual image and a dioptric group giving a real image.

Catadioptric designs with an outer-axially used concave field mirror are disclosed in WO 01/51979 A2 (Hudyama, Shafer et al.) and JP 2003-114387 (to Yasuhiro).

U.S. Pat. No. 4,812,028 (to Matsumoto) discloses a reflection-type reduction projection optical system comprising a first and a second subsystem which are combined to set the total Petzval sum to zero. More particular, the radii of curvatures of the first and second optical subsystems are selected such that the corresponding Petzval sums add up to zero, thereby completely correcting the Petzval sum of the entire system.

WO 03/050587 A2 (Shafer et al.) discloses a projection optical system having a catadioptric first objective part, which comprises a beam diverter device and a concave mirror, and a dioptric second objective part. The beam diverter device in the catadioptric first objective part comprises a first fold mirror surface diverting the radiation arriving from the object plane onto the concave mirror of the catadioptric first objective part, and a second fold mirror surface diverting the radiation arriving from the concave mirror to the dioptric second objective part. An intermediate image is created near the second fold mirror surface. In order to enable a design of the dioptric second objective part with relatively small lens dimensions, a positive refractive element is arranged behind the first fold mirror surface between the first fold mirror surface and the concave mirror.

U.S. Pat. No. 5,488,229 (to Elliott and Shafer) as well as U.S. Pat. No. 5,031,976 and U.S. Pat. No. 5,717,518 (to Shafer) disclose two-reflector configurations in a Deep-UV microlithography system, wherein an intermediate image produced by two reflectors (one being concave and one being substantially planar) is flattened by a group of refractive elements. Herein, the intermediate image is created near a central opening (aperture portion) in the concave mirror such that light from the intermediate image passes through the concave reflector to be reflected by the planar reflector onto the concave reflector and finally back to the planar reflector, in order to then pass through the same. A field lens group providing aberration correction is arranged at the position of the intermediate image or displaced relative to the same.

U.S. Pat. No. 6,600,608 B1 (to Shafer et al.), being assigned to the assignee of this invention and incorporated herein by reference, discloses an axially symmetric objective having, between two refractive partial objectives, a catoptric partial objective comprising, for making Petzval- and colour-correction, two opposite concave aspheric mirrors having two negative lenses between them and being provided with central holes, wherein said holes are arranged next to the intermediate images. A further embodiment (FIG. 3 of U.S. Pat. No. 6,600,608 B1) has a purely catoptric partial objective and a purely refractive partial objective, with the mirrors of the catoptric partial objective being purely used for Petzval correction (i.e. correction of the field-curvature) in order to relieve this burden from the refractive partial objective.

WO 2004/019128 (Omura et al.) discloses a combination of a reflection/refraction-type optical system and a configuration of a liquid-immersion optical system, in order to achieve a large image-side numerical aperture and a wide effective image forming area. For this purpose, in a lithographic immersion projection system the light is also passed through a catadioptric anastigmat comprising a concave mirror and at least one negative powered (Schupmann-) lens.

SUMMARY OF THE INVENTION

It is an object of the present invention to provide an alternate design for an optical imaging system which projects an image at high resolution over a wide field of view. It is a further object to provide a design which enables the use of optical systems having a comparably low degree of complexity and a compact design.

According to one aspect of the present invention, a projection system comprises at least two partial objectives, at least one intermediate image field between said partial objectives and a concave reflector having a concave reflecting surface, wherein said concave reflecting surface crosses an optical axis of said projection system proximate along said optical axis to said intermediate image field.

In the meaning of the present invention, an optical axis is a straight line or a sequence of straight line-sections which passes the respective centers of curvature of the optical components of the projection system. The term "proximate along the optical axis" is to be understood in the context of the explanations given in the present application and particularly the respective criterions given below, wherein deviations of the respective conditions given in the following by ±10%, more preferably ±5% are regarded as to be still comprised by the present invention.

According to a preferred embodiment, said concave reflecting surface crosses the optical axis of said projection system at a position meeting the condition $$|H_{CR}/H_{MR}| \geq 2 \tag{1},$$

more preferably $|H_{CR}/H_{MR}| \geq 3$, still more preferably $|H_{CR}/H_{MR}| \geq 4$, and still more preferably $|H_{CR}/H_{MR}| \geq 6$, with $H_{CR}$ being a chief ray height and $H_{MR}$ being a marginal ray height with respect to said optical axis.

According to another approach, said concave reflecting surface crosses an optical axis of said projection system at a position meeting the condition $$d = y*L, \tag{2}$$

with d being an axial distance from said concave reflecting surface to said intermediate image field, and with L being the total geometrical light path travelled by a light beam along said optical axis from said object field to said image field, wherein y ranges from 0 to 0.10, more preferably from 0.01 to 0.04.

The invention and/or specific embodiments thereof may achieve some or all of the following advantages:

a) Due to the arrangement of the concave reflector which is crossing the optical axis proximate to the intermediate image field, the invention enables the use of a relatively small concave reflector and a design being effectively centralized around the optical axis, thereby keeping the "Etendue" relatively small. A folding of the optical axis may be realized in a relatively narrow space, so that e.g. two partial objectives being arranged before or after the concave reflector need to be only slightly displaced to each other and a compact design may be realized. The arrangement of the concave reflector according to the present invention also enables a design of the further optical components with small dimensions. In particular, if a beam splitting element is used, the same may be of small size.

b) If e.g. the first partial objective and the second partial objective are both designed with an under-correction in their respective Petzval-sum, a total Petzval-correction in said optical system may be effectively provided by the concave reflector, namely by providing therein an overcorrection in the Petzval-sum corresponding to the sum of the Petzval-sums of both partial objectives. Accordingly, the present invention enables the use of simplified (non Petzval-corrected) partial objectives, which may be designed without several beam contractions and expansions (to be established by a plurality of negative and, positive lens groups). Accordingly, each partial objective may be shorter in axial direction and smaller in diameter perpendicular to the optical axis. High resolution projection objectives with high performance can be realized with typical axial lengths of 1.0 meters or less.

c) Since each partial objective can have a smaller number of lenses, the manufacturing costs are decreased. This is particularly advantageous if the system shall be adapted for illumination by a $F_2$-Eximer laser at 157 nm, since in this case all lenses are usually made of $CaF_2$ (being expensive and of limited availability). Of course, the microlithographic projection exposure apparatus may also use light sources of different wavelengths (e.g. 193 nm or 248 nm) and other lens materials like fused silica (quartz glass).

d) The reduced number of lenses required in each partial objective also enhances the transmission and contrast properties of the imaging system.

Optical designers have usually avoided an arranging of optical elements like mirrors and lenses close to an intermediate image field, i.e. an optically conjugated field in the optical light path, in view of the focussing effect at the intermediate image and accompanying thermal damages due to high power densities produced by the focussing of the excimer laser light. Furthermore, the possibilities to correct longitudinal chromatic aberrations are restricted compared to conventional arrangements of a concave mirror in a pupil of the objective, where the light rays are symmetric to the optical axis and where the marginal rays are in a relatively large distance to the optical axis, thereby enabling an effective correction of longitudinal chromatic aberrations. Therefore the inventive concept of placing a mirror devoid of any opening in the optical path with its optically effective (i.e. reflecting) surface crossing the optical axis proximate along the optical axis to an intermediate image field represents a renunciation of such conventional concepts. The inventive concept is based upon the consideration that especially for wavelengths of 193 nm and large image-side numerical apertures, the effective correction of the field curvature (or the Petzval sum) is of larger significance than e.g. a correction of chromatic aberrations.

According to a further aspect of the present invention, a projection system for imaging an object field onto an image field comprises at least one intermediate image field between said object field and said image field and a catadioptric or catoptric group comprising a concave reflector having a concave reflecting surface, said concave reflecting surface crossing an optical axis of said projection system proximate along said optical axis to said intermediate image field and having a vertex curvature adapted for a total Petzval-correction in said projection system by said catadioptric or catoptric group.

The vertex curvature of the concave reflector preferably meets the condition $$0.3 < \frac{SD_A}{NA} \cdot |c_M| < 1, \tag{3}$$

wherein $SD_A$ denotes a semi-diameter of an aperture-position next to the image plane of the projection system (e.g. a wafer plane of a projection exposure apparatus), NA denotes an image-side numerical aperture of the projection system and $c_M$ denotes the vertex curvature of the concave reflector. In the meaning of the present invention, said aperture-position is generally to be understood as the position of the one real plane which is conjugate to a system aperture plane and next to the image plane of the projection system (wherein each plane may also be regarded as being conjugate to itself).

According to a preferred embodiment, at least one of said first and second partial objectives is purely refractive. In particular, the at least one purely refractive partial objective may be a one-bulge objective being substantially devoid of any waist between an object plane and an image plane.

According to a further preferred embodiment, at least one of said first and second partial objectives is catadioptric. In one preferred embodiment, at least one of said first and second partial objectives may create one or more further intermediate image fields.

According to a preferred embodiment, the projection system further comprises a beam splitting element.

According to a preferred embodiment, said intermediate image field is created outside of said beam splitting element. In one preferred embodiment, said intermediate image field is created outside of said concave reflector.

According to a further preferred embodiment, said concave reflector is substantially spherical.

The concave reflector may, in a simple embodiment, be a single concave mirror. However, according to a preferred embodiment, the concave reflector cooperates with at least one negative lens. To this aim, either a suitable lens/mirror pair or an integrated element such as a "Mangin mirror" may be provided. The combination of (1) the mirror power of the concave reflector with (2) the lens power of the one or more negative lenses allows making the total power of this field group being composed of concave reflector and lens and the Petzval correction independently adjustable from each other. The total power of this field group being composed of the concave reflector and the negative-powered lens/lenses near the intermediate image plane gives an enhanced flexibility in positioning the pupil within the projection system, which may be particularly positioned either within the first or the second partial objective.

According to a preferred embodiment, the concave reflector is provided with a cooling, in order to account for the focussing effect taking place at the intermediate image and to counteract thermal damages form high power densities which may be produced by the focussing of the excimer laser light. Such a cooling may particularly comprise a water-cooling or Peltier element.

According to a preferred embodiment, said projection system projects an object field plane onto an image field plane such that said object field plane and said image field plane are parallel to each other.

According to a preferred embodiment, said projection system further comprises a fold mirror, wherein either said fold mirror or said beam splitting element folds the optical path into a direction parallel to the optical axis of the first partial objective.

According to a preferred embodiment, said projection system further comprises a second concave reflector, said second concave reflector reflecting a radiation component arriving from said beam splitting element without having passed said first concave reflector and superimposing said radiation component with radiation reflected by said first concave reflector.

Since the present invention is particularly advantageous in a projection system that is providing a large image-side numerical aperture and a wide effective image forming area, an advantageous embodiment of the present invention is an immersion projection system, wherein a space between a last lens element of the projection system and an image field plane includes an immersion medium having a refractive index of n>1.

An image-side numerical aperture NA of the projection system has preferably a value of $NA \geq 0.8$, more preferably of $NA \geq 1.2$, and still more preferably of $NA \geq 1.4$.

In view of the ability of the imaging system of the present invention to project an image at high resolution over a wide field of view, an image field created in an image field plane preferably has diameter of at least 13 mm, more preferably at least 26 mm.

Further aspects of the present invention are a microlithographic projection exposure apparatus, the use of a projection system for microlithographic projection exposure, a method of microlithographic structuring a substrate, a microstructured device, a microscope, a copying system having a magnification factor substantially corresponding to a value of 1, a flat panel display, and a liquid crystal device (LCD).

BRIEF DESCRIPTION OF THE DRAWINGS

The invention is described in more detail with reference to the following detailed description and based upon preferred embodiments shown in the drawings, in which:

FIG. 3-7 show various design alternatives of projection systems according to further embodiments of the present invention.

DETAILED DESCRIPTION OF PREFERRED EMBODIMENTS

Figure 1:
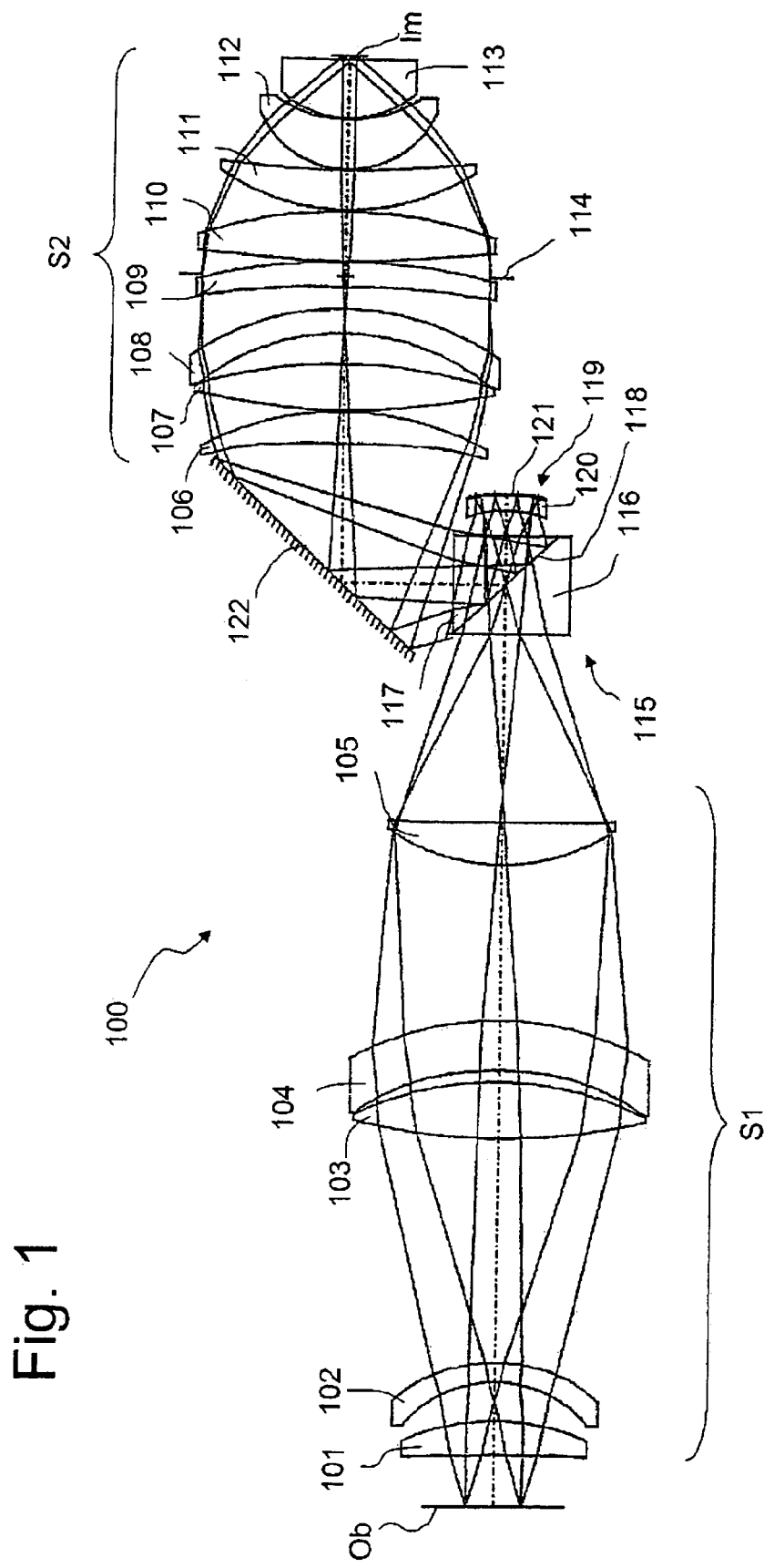
FIG. 1 shows a simplified meridional section through a projection system of the present invention according to a first embodiment.

FIG. 1 shows a simplified meridional section through a projection system 100 according to a first embodiment of the present invention. The projection system 100 is particularly suited for use in a microlithographic projection exposure apparatus, which images a mask (or reticle) onto a wafer, said mask being provided in the object plane and bearing a circuit pattern, and said wafer being provided in the image plane and bearing one or more light-sensitive layers, in order to transfer the circuit pattern onto the light-sensitive layers on the wafer. However, the present invention may also be realized in different imaging systems and with other kinds of substrates, e.g. optical gratings etc.

According to the first embodiment, the microlithographic projection exposure apparatus uses, as a light source, an Argon-Fluoride (ArF) excimer laser generating a radiation having a wavelength of 193 nm (corresponding to the deep ultraviolet=DUV). However, other wavelengths than 193 nm, e.g. 248 nm from a Krypton-Fluoride (KrF) excimer laser, or 157 nm (from a $F_2$-laser) are also applicable.

In the first embodiment, all lenses except for the last image-side lens are made from fused silica (quartz glass, $SiO_2$), whereas the last image-side lens is made from (less available and more expensive) calcium fluoride ($CaF_2$). While principally both and $CaF_2$ are preferred materials in the DUV with respect to their optical transmittance, other possible refractive materials being transparent in the DUV can e.g. comprise $BaF_2$, $SrF_2$, $MgF_2$, $LaF_3$ etc., as well as mixtures thereof.

Further, the first embodiment is designed as an immersion projection system wherein the space between the last image-side lens element and the image plane is immersed in liquid, or more generally a medium having a refractive index larger than 1.0. A suitable immersion liquid is pure water, having a refraction index at 193 nm of n≈1.43 and making it possible to realize relatively large image-side numerical apertures of NA=1.4 and higher. In the embodiment of FIG. 1, the numerical aperture amounts to NA≈1.10.

While the present invention is particularly advantageous in exposure systems having such high numerical apertures, the invention is of course not restricted thereto, but may also be advantageously realized in "dry" projection systems having e.g. numerical apertures of up to 0.8 or higher.

The design specifications of the first embodiment are more specifically given in Table 1, wherein the values in the first column denote the running number of a surface passed in the light path, taken for a beam passing from the object plane "Ob" to the image plane "Im". Column 2 gives the vertex radius of curvature (in mm) of the respective surface. Column 3 (named "thickness") gives the distance (in mm) to the next surface following in the forward direction of the beam path. Column 4 gives the material the optical component is made of. Column 5 gives its index of refraction and column 6 gives the semi-diameter of the respective component.

The projection system 100 comprises a first partial objective S1 and a second partial objective S2. The first partial objective S1 comprises a first lens group consisting of a positive-powered, nearly plan-convex lens 101 and a weakly negative-powered meniscus lens 102. The first lens group is followed by a second lens group consisting of a positive-powered, bi-convex lens 103 and a weakly positive-powered meniscus lens 104. The second lens group is followed by a positive-powered, nearly plan-convex lens 105.

The exit surfaces of the lenses 101, 102 and 105 as well as the entrance surface of the lens 104 are aspheric, with the aspheric constants being given in Table 2. The aspheric surfaces are described by $$P(h) = \frac{(1/r) \cdot h^2}{1 + \sqrt{1 - (1+K)(1/r)^2 h^2}} + C_1 h^4 + C_2 h^6 + \ldots \quad (4)$$

wherein P is the aspheric saggita as a function of the ray height h with respect to the optical axis, with the aspheric constants $C_1$ to $C_6$ as given in Table 2.

The second partial objective S2 starts with a positive-powered meniscus lens 106, followed by a positive-powered bi-convex lens 107 and a weakly negative-powered meniscus lens 108. Then are following a weakly positive-powered meniscus lens 109, in which region an aperture stop 114 is arranged, a positive-powered bi-convex lens 110, a positive-powered meniscus lens 111, a further positive-powered meniscus lens 112 and a positive-powered bi-convex lens 113 as the last image-side lens towards the image plane "Im". It should be noted that the aperture stop 114 does not have to be disposed only within the second partial objective S2, but can be disposed also at a suitable position within the first partial objective S1.

In the second partial objective S2, the entrance surfaces of the lenses 106 and 109 as well as the exit surfaces of the lenses 111 and 112 are aspheric, with the aspheric constants being also given in Table 2.

It can be seen from the drawing that both the first partial objective S1 (comprising lenses 101 to 105) and the second partial objective S2 (comprising lenses 106 to 113) are designed as one-bulge objectives in the sense of being devoid of waist-und-bulge-configurations with one or more waists.

As can also be gathered from FIG. 1, the projection system 100 further comprises a beam splitting optical element 115 being arranged in the light path between the first and second partial objectives S1, S2 and in the longitudinal extension of the first partial objective S1 along its optical axis.

The beam splitting optical element 115 (in the illustrated embodiment designed as a beam splitting cube) is a common example of a so-called physical beam-splitter. However, several types of beam splitting elements can be used according to the present invention.

The beam splitting element 115 may in particular be embodied as a polarization beam-splitter, which provides a good degree of efficiency in dividing any incident beam of linearly polarized light in such a way that the transverse magnetic (TM) and transverse electric (TE) polarization states are emerging from the beam splitting cube at right angles with respect to each other.

The beam splitting element 115 can also be realized as a conventional partial-refection (e.g. "50:50-") beam splitting cube composed of matched pairs of right angle prisms one of which having a partially reflecting film deposited on its face. Such a beam splitting element is provided by a first substantially triangular substrate, such as a prism 116 having a substantially plane surface corresponding to the hypotenuse of the prism 116 and being deposited with a partially reflecting thin film structure 118, and a second substantially triangular substrate, such as a prism 117, having a substantially plane surface corresponding to the hypotenuse of the prism 117 and being deposited onto the hypotenuse of the first prism 116. The partially reflecting film structure 118 divides each light beam into a transmitted and a reflected portion in such a way that the beam suffers no net aberrations as a result of multiple refractions in the film structure 118 and the second triangular substrate 117.

The beam splitting optical element 115 may principally also be substituted by other physical beam-splitting elements, such as e.g. a plan-parallel plate being arranged obliquely to the incident light beam, for example at a typical angle of 45° with respect to the optical axis. Of course, other optical elements performing a beam splitting, as e.g. diffraction gratings, as well as other relative angles of their arrangement with respect to the optical axis can also be used.

The use of a physical beam splitting element such as the beam splitting cube 115 is particularly advantageous since it enables to centralize the object- and image-fields with respect to the optical axis. However, other embodiments of the present invention providing an off-axis system may alternatively include, additionally to or instead of the beam splitting element 115, other reflecting prism combinations generating off-axis emerging rays, or one or more geometrical beam splitting elements such as multi-mirror arrangements or the like.

Following to the beam splitting element 115 along the optical axis in direction away from the object plane "Ob", and on the side of the beam splitting element 115 opposite to the first partial objective S1, a concave reflector 119 is arranged. In the illustrated first embodiment, said concave reflector 119 is designed as a so-called "Mangin element", which has to be understood according to the present invention as a combined pair of a negative-powered lens 120 and a concave mirror 121. According to a further embodiment, the concave reflector 119 can comprise a fused silica meniscus lens with a concave reflective surface coating on a back surface of the lens, wherein the reflective coating can e.g. be composed of aluminium (Al), molybdenum (Mo), tungsten (W) and/or chromium (Cr), possibly provided with a oxidation-protecting surface coating of e.g. MgF$_2$.

The combination of the mirror power provided by the concave reflector with the lens power of the negative powered lens allows making the total power of this field group (mirror plus lens/lenses) and the Petzval correction independently adjustable from each other, so that any desirable values can be adjusted. In particular, the inventive combination of the mirror power provided by the concave reflector with the lens power of the negative powered lens in or close to the intermediate image enhances the flexibility in both correcting the image field curvature provided by the whole projection system and positioning the pupil within the first or the second partial objective.

The integration of the concave mirror 121 with one negative powered lens 120 is only one embodiment of the present invention. Alternatively, the Mangin-element 119 can be substituted by a mutually separated pair of a concave mirror and one or more negative lenses. Moreover, the present invention may alternatively and principally be realized with just a single concave mirror in or close to the intermediate image plane, i.e. without any additional, either integrated or mutually separated negative lens element.

While the Mangin-element 119 according to the illustrated first embodiment simplifies the manufacturing effort if compared to mutually separated mirror-lens pairs, an advantage of mutually separated mirror-lens pairs is the introduction of additional parameters (radii, distances, refraction indices, aspheres) into the projection system, thereby enabling a variation of these parameters in order to further optimize aberration optimization in the projection system.

According to the present invention, the Mangin-element, or the mirror-lens pair, respectively, is working with a substantially normal incidence of chief rays on the concave reflector, i.e. the chief rays are essentially perpendicular to the mirror surface tangent. As a consequence, the concave reflector can be substantially spherical without thereby introducing significant pupil aberrations. This is a significant advantage compared to conventional designs having off-axis mirrors which have to be made aspheric in order to prevent large pupil aberrations.

Furthermore, the diameters of both the mirror and the negative lens (integrated or not) perpendicular to the optical axis are relatively small, thereby reducing axial chromatic aberrations. As a further advantage of the reduced diameters, the compactness of the projection system is enhanced.

The vertex curvature of the concave reflector preferably meets the condition (3)

$$0.3 < \frac{SD_A}{NA} \cdot |c_M| < 1, \quad (3)$$

wherein $SD_A$ denotes a semi-diameter of an aperture-position next to the image plane of the projection system (e.g. a wafer plane of a projection exposure apparatus), NA denotes an image-side numerical aperture of the projection system and $c_M$ denotes the vertex curvature of the concave reflector.

In the specific embodiment of FIG. 1 and as can be gathered from Table 1, $SD_A$ amounts to ≈110 mm and $|c_M|=1/r$ amounts to ≈1/153 mm. Since NA of the present embodiment amounts to ≈1.10, a value for $$\frac{SD_A}{NA} \cdot |c_M| \approx 0.654$$

is obtained in line with equation (3).

As mentioned above, $SD_A$ denotes a semi-diameter of an aperture-position next to the image plane of the projection system, e.g. the position of the aperture 114 in FIG. 1. In the meaning of the present invention, said aperture-position is generally to be understood as the position of the one real plane which is conjugate to a system aperture plane and next to the image plane of the projection system (wherein each plane may also be regarded as being conjugate to itself).

As to the relative position of the concave reflector with respect to the intermediate image field, the concave reflecting surface of the concave reflector preferably crosses the optical axis of said projection system at a position meeting the condition $$|H_{CR}/H_{MR}| \geq 2 \quad (1),$$

more preferably $|H_{CR}/H_{MR}| \geq 3$, still more preferably $|H_{CR}/H_{MR}| \geq 4$, and still more preferably $|H_{CR}/H_{MR}| \geq 6$, with $H_{CR}$ being a chief ray height and $H_{MR}$ being a marginal ray height with respect to said optical axis.

According to another approach, the axial distance d between the reflecting surface of said concave reflector and said intermediate image field along said optical axis is given by $$d=y*L \quad (2),$$

with L being the total geometrical light path travelled by a light beam along said optical axis from said object field to said image field, wherein y ranges from 0 to 0.10, more preferably from 0.01 to 0.04.

In the specific embodiment of FIG. 1, the value of L amounts to ≈1435 mm, while d amounts to ≈38.478 mm, so a value of y≈0.0268 is obtained in line with the above limits given for equation (2).

The relative position of the concave reflector 119 with respect to the intermediate image field can be selected, according to one embodiment of the present invention, such that the intermediate image field is created outside the beam splitting element 115 and the concave reflector 119, such that neither a paraxial nor a marginal ray intermediate image are created within the concave reflector 119 (in particular the negative lens 120) or the beam splitting element 115. Such a design disposing the intermediate image field in the solid-material-free intermediate space between the concave reflector 119 and the beam splitter cube 115 has the advantage that any non-homogeneities, impurities or the like, which may exist in said optical elements 115 and 119, are not reproduced in the final image plane of the projection system 100.

Alternatively, according to another embodiment of the present invention being particularly suitable if sufficient care is taken to keep the respective optical element (concave reflector 119, in particular negative lens 120, or beam splitter cube 115) at least substantially free of non-homogeneities, impurities or the like, it is also possible to dispose the paraxial and/or the marginal ray image either within the concave reflector 119, more specifically the negative lens 120, or the beam splitter cube 115.

The term "proximate", which is used in the present application to define the position of the intermediate image plane in relation to the reflecting surface of the concave reflector, is to be understood in the context of the present application such that deviations of the relative positions defined by the conditions (1) or (2) by ±10%, more preferably ±5%, are also comprised by the present invention. Further, the invention comprises relative arrangements of the paraxial and/or the marginal ray image either within the concave reflector 119, in particular the negative lens 120, or the beam splitter cube 115, or in the solid-material-free intermediate space between the concave reflector 119 and the beam splitter cube 115.

Going back to FIG. 1, the projection system 100 further comprises a substantially planar folding mirror 122 along the optical path between the beam splitting element 115 and the second partial objective S2. The folding mirror 122 is optional and only serves to fold the incoming light beams between the beam splitting element 115 and the second partial objective S2. Of course the present invention may alternatively be realized without any folding mirror, e.g. in an arrangement wherein at least two partial objectives, such as the partial objectives S1 and S2 of FIG. 1, are arranged with optical axes including an angle of e.g. 90° to each other.

In the illustrated first embodiment, the folding mirror folds radiation arriving from the beam splitting element 115 into a direction parallel to the optical axis of the first partial objective S1. Such a folding further enhances, as one advantageous effect, the compactness of the projection system 100. Furthermore, such a folding enables making the object plane and the image plane of the projection system 100 parallel to each other, which is particularly advantageous during the scanning process in order to provide a well-defined and conforming orientation of the object—and image-plane with respect to the direction of gravity.

Of course, the illustration and description of the projection system 100 as the first preferred embodiment is to be understood just by way of example, so that each lens group of the first and second partial objectives S1, S2 may comprise a different number of lenses or lenses with modified power, also considering that each additional optical component or surface being present in the optical path enhances the number of free parameters which may be varied e.g. for optimum correction of aberrations, but also enhances the manufacturing efforts. Accordingly, the projection system according to the first embodiment just serves as an example for a projection system comprising two purely refractive partial objectives, with at least one intermediate image plane in between them.

Figure 2:
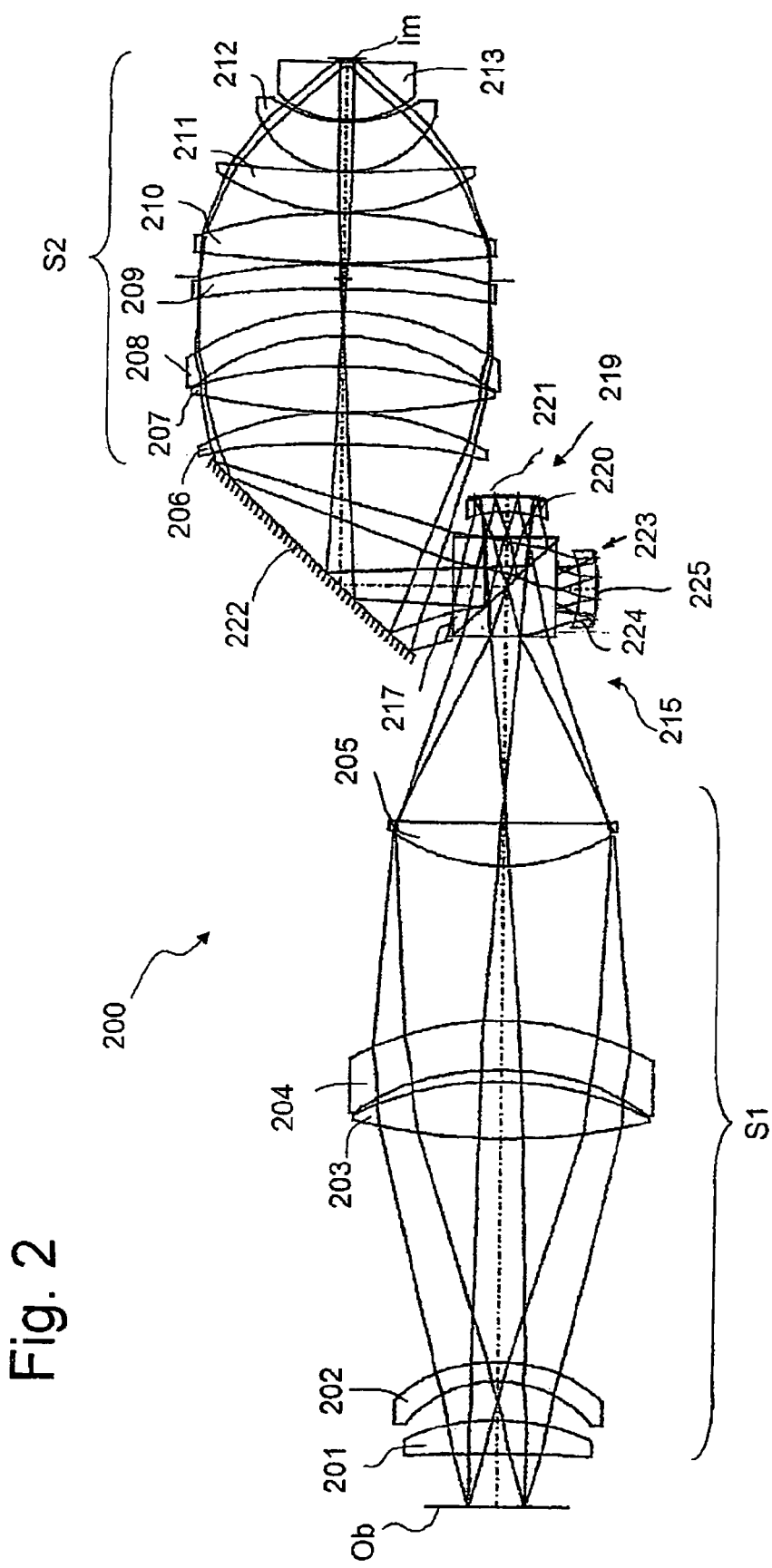
FIG. 2 shows a simplified meridional section through a projection system of the present invention according to a second embodiment.

According to a further embodiment of the present invention illustrated in FIG. 2, a projection system 200 may comprise a second concave reflector 223, which can be in particular identical to the concave reflector 219, i.e. comprising a pair of a negative-powered lens 224 and a concave mirror 225. Since the remaining elements in the projection system 200 correspond to those of the projection system 200 shown in FIG. 1, they are designated with reference numbers increased by 100, while their detailed description is omitted herein.

Like the first concave reflector 219, the second concave reflector 223 is located in the optical path following to the beam splitting element 215, but at a relative position thereto being displaced by an angle of 90° with respect to the first concave reflector 219 such that the concave reflecting surface of the second concave reflector 223 faces to the incident direction of the irradiation reflected by the partially reflecting film structure 218. Consequently, light rays which have been reflected by the partially reflecting film structure 218 of the beam splitting element 215 are incident on the concave reflecting surface of the concave reflector 223 and reflected back towards the beam splitting element 215, where they are again partially reflected at the partially reflecting film structure 218.

As a result of the presence of the second concave reflector 223, a complete loss of the light rays being initially reflected by the partially reflecting film structure 218 is avoided. Consequently, the energy throughput going through the second partial objective S2 is enhanced by a factor of two, which also doubles the degree of efficiency of the projection system 200.

It should however be noted that in view of the two separate contributions of both concave reflectors 219, 223 in the second embodiment on the radiation passing the second partial objective S2 towards the image plane "Im", particular care has to be taken to achieve a correct overlap of both contributions in the image plane "Im". In order to avoid creation of a significant overlap-error (i.e. relative image displacement) of both contributions that deteriorates the result of the microlithographic process, said overlap between the two contributions has to be optimized with such a precision that any displacement between the two partial images in the image field plane "Im" should preferably be less than 1 nm.

Although this requirement puts relatively high demands to the precision and adjusting of the second concave reflector 123, some kind of relieve is given by the fact that it is only the precision and adjusting of the second concave reflector 123 that affects the finally obtained overlap, since all remaining optical elements following to the beam splitting element 115 in the optical path of the projection system 200 are passed by both light paths, i.e. both radiation contributions after reflection on the first concave reflector 119 and the second concave reflector 123.

Various further design alternatives showing further embodiments of the present invention are illustrated in the schematic plan views of FIG. 3 to 7.

Figure 7:
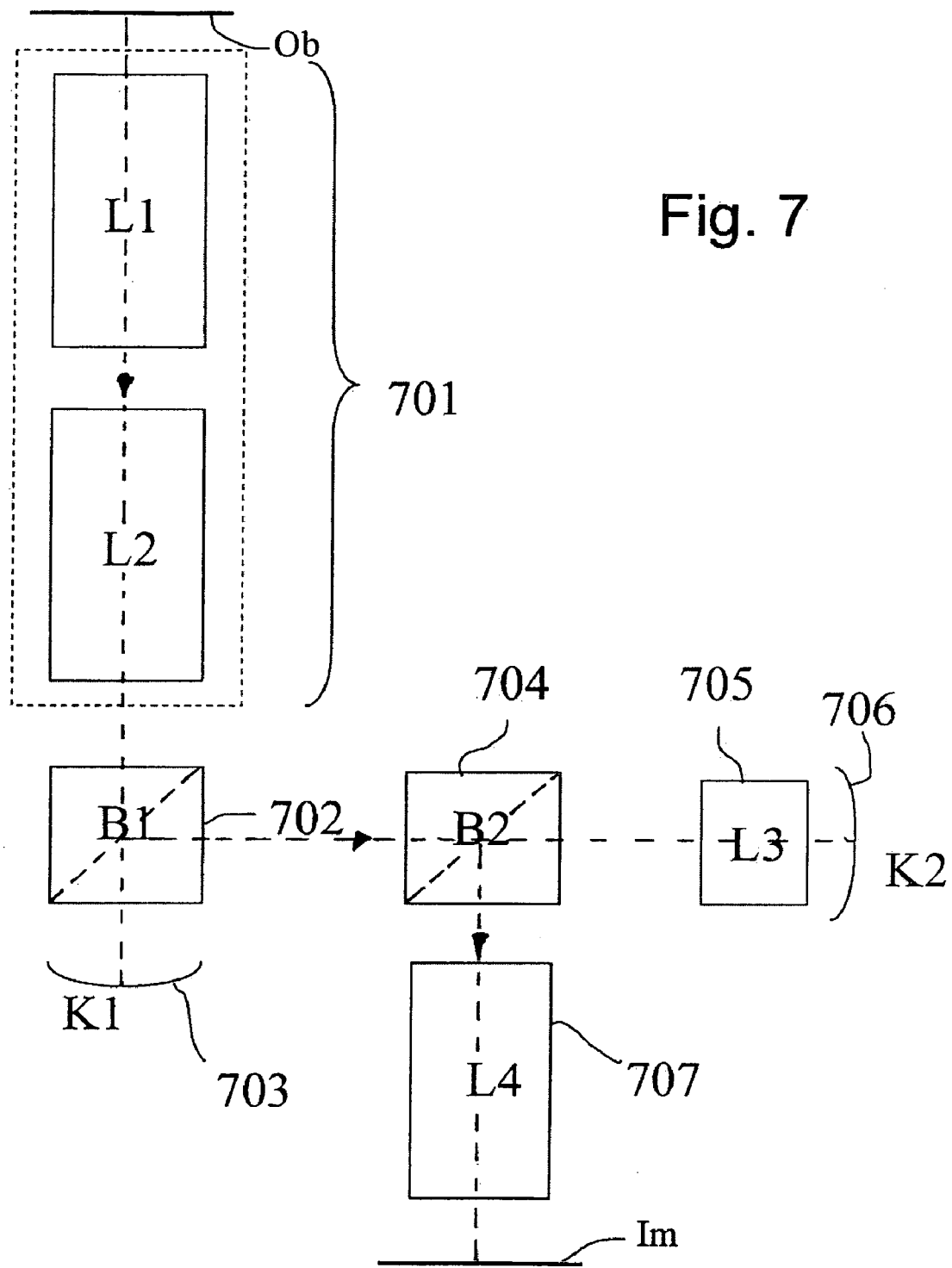

While FIG. 3 schematically represents the relative arrangement of the several optical elements in the projection system 100 of FIG. 1, different relative arrangements of these optical elements are exemplarily proposed FIG. 4-6. A further, more sophisticated embodiment of the present invention is schematically illustrated in FIG. 7. All these embodiments have to be understood just by way of example, so a person skilled in the art will find a large variety of further modifications being also covered by the present invention.

In FIG. 3, illustrating in a plan view a relative arrangement 300 of the several optical elements in a projection system, the first partial objective is designated with reference number "301". In line with the embodiment of FIG. 1, the further optical elements following thereto along the beam path are a beam splitting element 302, a concave reflector 303 (here just embodied as a simple concave mirror), a planar fold mirror 304 and a second partial objective 305.

The arrangement in the projection system 400 shown in FIG. 4 corresponds to that of FIG. 3 (and with reference numbers increased by 100), with the only difference that the concave reflector 403 is located in the optical path following to the beam splitting element 402 at a relative position thereto being displaced by an angle of 90° compared to the concave reflector 303, such that the concave reflecting surface of the concave reflector 403 faces to the incident direction of the irradiation reflected in the beam splitting element 402.

As shown and discussed above with respect to FIG. 2, the embodiments of FIGS. 3 and 4 can also be combined by providing two concave reflectors at the respective positions of the concave reflectors 303 and 403, respectively.

According to the further embodiment of a projection system 500 shown in FIG. 5 (having the corresponding optical elements like projection system 400, with reference numbers increased by 100), the order of the beam splitting element 502, the concave reflector 503 and the planar fold mirror 504 is modified compared to FIGS. 3 and 4. More specifically, the radiation coming from the first partial objective 501 is initially reflected from the planar fold mirror 504 and folded to the beam splitting element 502, the latter being laterally displaced with respect to the optical axis of the first partial objective 501. The radiation transmitted by the beam splitting element 502 is incident on the concave reflector 503 being positioned on the side of the beam splitting element 502 opposite to the fold mirror 504, and reflected back towards the beam splitting element 502, to be again partially reflected towards the second partial objective 505.

The arrangement in the projection system 600 shown in FIG. 6 corresponds to that of FIG. 5 (with reference numbers increased by 100), with the only difference that the concave reflector 603 is located in the optical path following to the beam splitting element 602 at a relative position thereto being displaced by an angle of 90° compared to the concave reflector 603, such that the concave reflecting surface of the concave reflector 603 faces to the incident direction of the irradiation reflected in the beam splitting element 602.

Again, the embodiments of FIGS. 5 and 6 can also be combined by providing two concave reflectors at the respective positions of the concave reflectors 503 and 603, respectively.

As shown in the schematically plan view FIG. 7, a projection system 700 according to a further, more sophisticated embodiment of the present invention comprises a first partial objective 701 being composed of two distinct lens groups L1 and L2, between which a further intermediate image field (not illustrated in the drawing) may be formed. Similar to the embodiments discussed above in connection to FIG. 1-6, a beam splitting element 702 and a concave reflector 703 are disposed following to the first partial objective 701 along the beam path. A laterally displaced second beam splitting element 704 divides the radiation coming from the first beam splitting element 702 to a negative-powered lens 705 being followed along the beam path by a second concave reflector 706, as well as a 90°displaced second partial objective 707, the latter being followed by a final image plane "Im" of the projection system 700. The axial position and vertex curvature of the first concave reflector 703 are selected as already discussed in line with the embodiments shown in FIG. 1-6 in order to substantially compensate for a total image field curvature in the projection system 700. The two beam splitting elements 702 and 704 provide for a parallel orientation of the object and image field of the projection system 100 without using a planar fold mirror.

The present invention may also be realized with more than two partial objectives as well as with objectives which are not or not purely refractive, i.e. catoptric or catadioptric partial objectives, which also may provide more than one intermediate image plane in between them, and/or one or more intermediate image planes in the light path of at least one of the partial objectives.

Furthermore, although the possibility of designing each partial objective in the projection system of the present invention with only one bulge, i.e. being devoid of waist-und-bulge-configurations with one or more waists, this is also not a necessary limitation for the present invention, which may, principally, be realized also in more sophisticated designs having one or more waist-und-bulge-configurations.

The above description of preferred embodiments has been given by way of example. A person skilled in the art will, however, not only understand the present inventions and its advantages, but will also find suitable modifications thereof. Therefore, the present invention is intended to cover all such changes and modifications as far as falling within the spirit and scope of the invention as defined in the appended claims and the equivalents thereof.

TABLE 1

| SURF | RADIUS | THICK-NESS | MATERIAL | INDEX | SEMIDIAM. |
|---|---|---|---|---|---|
| 0 | 0.0000 | 41.8359 | | | 53.0 |
| 1 | −1131.8298 | 27.0000 | SIO2 | 1.560491 | 64.5 |
| 2 | −168.7554 | 30.8943 | | | 67.4 |
| 3 | −88.2681 | 15.0002 | SIO2 | 1.560491 | 67.9 |
| 4 | −134.4482 | 181.0300 | | | 75.5 |
| 5 | 448.6385 | 45.0000 | SIO2 | 1.560491 | 107.4 |
| 6 | −241.1795 | 9.6734 | | | 107.4 |
| 7 | −231.2358 | 39.9632 | SIO2 | 1.560491 | 106.5 |
| 8 | −222.2601 | 125.9984 | | | 110.5 |
| 9 | 139.7373 | 35.0000 | SIO2 | 1.560491 | 82.9 |
| 10 | −3057.2330 | 150.5296 | | | 80.5 |
| 11 | 0.0000 | 80.0000 | SIO2 | 1.560491 | 45.0 |
| 12 | 0.0000 | 20.0000 | | | 44.9 |
| 13 | −78.6364 | 12.0000 | SIO2 | 1.560491 | 46.6 |
| 14 | −153.1015 | −12.0000 | REFL | 1.560491 | 55.3 |
| 15 | −78.6364 | −20.0000 | | | 50.4 |
| 16 | 0.0000 | −40.0000 | SIO2 | 1.560491 | 50.5 |
| 17 | 0.0000 | 40.0000 | REFL | 1.560491 | 50.0 |
| 18 | 0.0000 | 85.0000 | | | 60.8 |
| 19 | 0.0000 | −111.8597 | REFL | | 80.0 |
| 20 | 1791.3085 | −25.5565 | SIO2 | 1.560491 | 103.3 |
| 21 | 220.9991 | −1.0000 | | | 105.6 |
| 22 | −478.4461 | −37.5520 | SIO2 | 1.560491 | 110.7 |
| 23 | 367.8345 | −24.8431 | | | 110.7 |
| 24 | 168.4686 | −19.9997 | SIO2 | 1.560491 | 110.6 |
| 25 | 197.2099 | −17.6548 | | | 115.1 |
| 26 | 642.6763 | −20.0000 | SIO2 | 1.560491 | 110.6 |
| 27 | 430.2525 | 11.9350 | | | 110.6 |
| AST | 0.0000 | −12.9350 | | | 110.2 |
| 29 | −824.0332 | −40.0000 | SIO2 | 1.560491 | 110.1 |
| 30 | 333.2339 | −1.0000 | | | 109.3 |
| 31 | −168.6331 | −32.1272 | SIO2 | 1.560491 | 94.7 |
| 32 | −544.8262 | −1.0000 | | | 90.9 |
| 33 | −72.6338 | −40.6877 | SIO2 | 1.560491 | 66.0 |
| 34 | −109.7180 | −1.0000 | | | 52.4 |
| 35 | −78.1464 | −46.0410 | CAF2 | 1.501106 | 48.6 |
| 36 | 0.0000 | −3.0000 | WATER | 1.436800 | 16.9 |
| 37 | 0.0000 | 0.0000 | | 0.000000 | 13.3 |

TABLE 2

Aspheric constants

| | SRF | | | | |
|---|---|---|---|---|---|
| | 2 | 4 | 7 | 10 | 14 |
| K  | 0 | 0 | 0 | 0 | 0 |
| C1 | 2.497859E−08 | −1.392485E−07 | −5.284879E−08 | 3.163498E−08 | 8.420791E−09 |
| C2 | −8.397483E−12 | 2.143337E−12 | 3.285496E−13 | 1.205049E−12 | 2.418307E−13 |
| C3 | 2.707613E−16 | −7.556194E−16 | 1.099642E−17 | −1.343573E−16 | −1.243872E−16 |
| C4 | −3.051379E−19 | 7.172437E−20 | 2.374104E−23 | 1.159462E−20 | 7.107745E−20 |
| C5 | 5.594187E−23 | −1.141806E−23 | −2.871025E−26 | −8.451466E−25 | −1.771815E−23 |
| C6 | −6.576220E−27 | 7.933474E−28 | 1.050732E−30 | 2.930230E−29 | 1.743197E−27 |

| | SRF | | | |
|---|---|---|---|---|
| | 20 | 26 | 32 | 34 |
| K  | 0 | 0 | 0 | 0 |
| C1 | 4.698300E−08 | −3.868949E−09 | 3.726324E−08 | −2.226517E−07 |
| C2 | 6.284417E−13 | −2.173193E−13 | −3.281198E−13 | −6.764655E−12 |
| C3 | 1.202384E−17 | 4.418664E−17 | −2.130182E−16 | 4.377510E−15 |
| C4 | 7.987229E−22 | −2.613444E−21 | 1.813826E−20 | −1.710498E−18 |
| C5 | 6.425464E−26 | 9.184993E−26 | −6.048162E−25 | 4.138025E−22 |
| C6 | 1.688259E−30 | −1.420975E−30 | 6.139006E−30 | −6.273123E−26 |

What is claimed is:

1. A projection system for imaging an object field onto an image field, said projection system comprising:
   at least two partial objectives;
   at least one intermediate image field between said partial objectives; and
   a concave reflector having a concave reflecting surface;
   wherein said concave reflecting surface satisfies at least one of the following conditions:
   (a) said concave reflecting surface crosses an optical axis of said projection system proximate along the optical axis to the intermediate image field; or
   (b) said concave reflecting surface crosses the optical axis of said projection system at a position where the condition $|H_{CR}/H_{MR}| \geq 2$ is met, with $H_{CR}$ being a chief ray height and $H_{MR}$ being a marginal ray height with respect to the optical axis; or
   (c) said concave reflecting surface crosses the optical axis of said projection system at a position where the condition $d = y*L$ is met, with d being an axial distance from said concave reflecting surface to the intermediate image field, and with L being the total geometrical light path travelled by a light beam along the optical axis from the object field to the image field, wherein y ranges from 0 to 0.10.

2. The projection system according to claim 1, wherein a vertex curvature of said concave reflector meets the condition $$0.3 < \frac{SD_A}{NA} \cdot |c_M| < 1,$$

wherein $SD_A$ denotes a semi-diameter of an aperture-position next to an image plane of said projection system, NA denotes an image-side numerical aperture of said projection system and $c_M$ denotes the vertex curvature of said concave reflector.

3. The projection system according to claim 1, wherein at least one of said first and second partial objectives is purely refractive.

4. The projection system according to claim 3, wherein the at least one purely refractive partial objective is a one-bulge objective being substantially devoid of any waist between an object plane and an image plane.

5. The projection system according to claim 1, wherein at least one of said first and second partial objectives is catadioptric.

6. The projection system according to claim 1, wherein at least one of said first and second partial objectives creates at least one further intermediate image field.

7. The projection system according to claim 1, further comprising a beam splitting element.

8. The projection system according to claim 7, wherein said intermediate image field is created outside of said beam splitting element.

9. The projection system according to claim 1, wherein said intermediate image field is created outside of said concave reflector.

10. The projection system according to claim 1, wherein said concave reflector is substantially spherical.

11. The projection system according to claim 1, wherein said concave reflector comprises a concave mirror and at least one negative lens proximate to said concave mirror.

12. The projection system according to claim 11, wherein said concave mirror and said at least one negative lens are combined as a Mangin mirror.

13. The projection system according to claim 1, wherein said concave reflector is provided with a cooling.

14. The projection system according to claim 13, wherein said cooling comprises a water cooling or a Peltier element.

15. The projection system according to claim 1, wherein said projection system projects an object field plane onto an image field plane such that the object field plane and the image field plane are parallel to each other.

16. The projection system according to claim 1, further comprising a fold mirror, wherein either said fold mirror or said beam splitting element folds the optical path into a direction parallel to the optical axis of said first partial objective.

17. The projection system according to claim 1, further comprising a second concave reflector, said second concave reflector reflecting a radiation component arriving from said beam splitting element without having passed said first concave reflector and superimposing said radiation component with radiation reflected by said first concave reflector.

18. The projection system according to claim 1, wherein a space between a last lens element of the projection system and an image field plane of the projections system includes an immersion medium having a refractive index of n>1.

19. The projection system according to claim 1, wherein an image-side numerical aperture NA of the projection system has a value of NA≧0.8.

20. The projection system according to claim 1, wherein an image field created in an image field plane has a diameter of at least 13 mm.

21. The projection system according to claim 20, wherein the image field has a diameter of at least 26 mm.

22. A microlithographic projection exposure apparatus comprising a projection system according to claim 1.

23. A method of microlithographic structuring a substrate comprising:
    illuminating a mask with light; and
    projecting an image of said mask onto said substrate through a projection system as claimed in claim 1.

24. A microstructured device, fabricated according to the method of claim 23.

25. A microscope comprising a projection system as claimed in claim 1.

26. A copying system having a magnification factor substantially corresponding to a value of 1 and comprising a projection system as claimed in claim 1.

27. A flat panel display comprising a projection system as claimed in claim 1.

28. A liquid crystal display device comprising a projection system as claimed in claim 1.

29. A projection system for imaging an object field onto an image field, said projection system comprising:
    at least two partial objectives;
    at least one intermediate image field between said partial objectives; and
    a concave reflector having a concave reflecting surface;
    wherein said concave reflecting surface crosses an optical axis of said projection system at a position where the condition $|H_{CR}/H_{MR}| \geq 2$ is met, with $H_{CR}$ being a chief ray height and $H_{MR}$ being a marginal ray height with respect to the optical axis.

30. The projection system according to claim 29, wherein said concave reflecting surface crosses an optical axis of said projection system at a position where the condition $|H_{CR}/H_{MR}| \geq 6$ is satisfied.

31. A projection system for imaging an object field onto an image field, said projection system comprising:
    at least two partial objectives;
    at least one intermediate image field between said partial objectives; and
    a concave reflector having a concave reflecting surface;
    wherein said concave reflecting surface crosses an optical axis of said projection system at a position where the condition d=y*L is met, with d being an axial distance from said concave reflecting surface to the intermediate image field, and with L being the total geometrical light path travelled by a light beam along the optical axis from the object field to the image field, wherein y ranges from 0 to 0.10.

32. The projection system according to claim 31, wherein y ranges from 0.01 to 0.04.

33. A projection system for imaging an object field onto an image field, said projection system comprising:
    at least one intermediate image field between the object field and the image field; and
    a catadioptric or catoptric group comprising a concave reflector having a concave reflecting surface, said concave reflecting surface crossing an optical axis of said projection system proximate along the optical axis to the intermediate image field and having a vertex curvature adapted for a total Petzval-correction in said projection system by said catadioptric or catoptric group.

34. A projection system according to claim 33, wherein said concave reflector is arranged at a position along the optical axis meeting the condition $|H_{CR}/H_{MR}| \geq 2$, with $H_{CR}$ being a chief ray height and $H_{MR}$ being a marginal ray height with respect to the optical axis.

35. A projection system according to claim 33, wherein said concave reflector is arranged in an axial distance d from the intermediate image field, wherein d meets the condition d=y*L, with L being the total geometrical light path travelled by a light beam along the optical axis from the object field to the image field, wherein y ranges from 0 to 0.10.

* * * * *